United States Patent
Hornung et al.

(10) Patent No.: US 7,033,879 B2
(45) Date of Patent: Apr. 25, 2006

(54) SEMICONDUCTOR DEVICE HAVING OPTIMIZED SHALLOW JUNCTION GEOMETRIES AND METHOD FOR FABRICATION THEREOF

(75) Inventors: Brian E. Hornung, Richardson, TX (US); Xin Zhang, Plano, TX (US); Lance S. Robertson, Rockwall, TX (US); Srinivasan Chakravarthi, Richardson, TX (US); Beriannan Chidambaram, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/835,121

(22) Filed: Apr. 29, 2004

(65) Prior Publication Data

US 2005/0245021 A1 Nov. 3, 2005

(51) Int. Cl.
*H01L 21/8238* (2006.01)
*H01L 21/336* (2006.01)

(52) U.S. Cl. .................. 438/231; 438/302; 438/233

(58) Field of Classification Search ............... 438/231, 438/230, 232, 233, 234, 199, 149, 302, 300, 438/303, 306
See application file for complete search history.

(56) References Cited

U.S. PATENT DOCUMENTS

2002/0068410 A1 * 6/2002 Tseng et al. ............... 438/305

2005/0121750 A1 * 6/2005 Chan et al. .................. 257/643

OTHER PUBLICATIONS

B. Hornung, et al.; "A High Performance 90 nm Logic Technology with A 37nm Gate Length, Dual Plasma Nitrided Gate Dielectric and Differential Offset Spacer": 2003 Symposium on VLSI Technology.

* cited by examiner

*Primary Examiner*—Michael Lebentritt
*Assistant Examiner*—Walter L. Lindsay, Jr.
(74) *Attorney, Agent, or Firm*—Rose Alyssa Keagy; W. James Brady, III; Frederick J. Telecky, Jr.

(57) ABSTRACT

The present invention provides, in one embodiment, a method of fabricating a semiconductor device (100). The method comprises growing an oxide layer (120) on a gate structure (114) and a substrate (102) and implanting a dopant (124) into the substrate (102) and the oxide layer (120). Implantation is such that a portion of the dopant (124) remains in the oxide layer (120) to form an implanted oxide layer (126). The method further includes depositing a protective oxide layer (132) on the implanted oxide layer (126) and forming etch-resistant off-set spacers (134). The etch-resistant off-set spacers (134) are formed adjacent sidewalls of the gate structure (114) and on the protective oxide layer (132). The etch resistant off-set spacers having an inner perimeter (135) adjacent the sidewalls and an opposing outer perimeter (136). The method also comprises removing portions of the protective oxide layer (132) lying outside the outer perimeter (136) of the etch-resistant off-set spacers (134). Other embodiments of the present invention include a transistor device (200) and method of manufacturing an integrated circuit (300).

13 Claims, 7 Drawing Sheets

SEMICONDUCTOR DEVICE HAVING OPTIMIZED SHALLOW JUNCTION GEOMETRIES AND METHOD FOR FABRICATION THEREOF

TECHNICAL FIELD OF THE INVENTION

The present invention is directed in general to the manufacture of semiconductor devices, and, more specifically, to a method of fabricating transistor devices having optimized shallow junction geometries.

BACKGROUND OF THE INVENTION

The continuing push to produce faster semiconductor devices with lower power consumption has resulted in the miniaturization of semiconductor devices. In particular, smaller gate oxide thickness and channel width are conducive to the low voltage and faster operation of transistor devices, such as complementary metal oxide (CMOS) transistors. With shrinking process geometries, comes a number of new design problems, however.

For instance, as gate dimensions are reduced, it has become necessary to adjust and better control the dimensions of the channel and doped regions of the substrate that are associated with the gate. This is necessary to prevent a number of short channel effects, such as hot carrier injection, leakage currents, drain induced barrier lowering (DIBL), threshold voltage variation and mobility degradation.

Consider, for instance, the dimensions of shallow junctions and pocket region structures. Shallow junctions, also referred to as source drain extensions, or light or middle-doped drain (LDD and MDD, respectively) regions, are implanted as extensions to the larger and more heavily doped source and drain regions, to reduce hot carrier injection-induced damage to gate dielectric layers and drifting threshold voltage. Hot carriers, electrons with higher than average energy, form because of the stronger electric fields produced in small transistor device geometries. Shallow junctions, implanted before sidewall formation and source and drain implantation, provide a doping gradient between the source and drain regions and the channel. The lowered electric field in the vicinity of the channel region of such devices reduces the formation of hot carriers.

Sub-0.1 micron transistor devices are also highly susceptible to leakage currents, or punch-through, when the transistor is off. Leakage currents can be reduced if the shallow junctions are formed with well-defined boundaries, as exemplified by an abrupt decrease in dopant concentration, to support low-voltage operation of the transistor and to define the width of the channel region of the transistor. The formation of abrupt shallow junctions can be problematic in certain instances, however.

For, instance, to establish p-type doped shallow junctions in a positive channel metal oxide semiconductor (PMOS) transistor, a typical p-type dopant is boron ($B^+$). Small dopants, such as boron, are subject to undesirable enhanced diffusion into implantation-caused damage to the lattice structures of silicon substrates during thermal annealing. This phenomenon, known as transient enhanced diffusion (TED), is undesirable because it decreases the abruptness of the change in dopant concentrations from the shallow junction to a p-well or n-well that the shallow junction is formed in. TED deters the formation of shallow junctions having suitably shallow depths (e.g., less than about 40 nm). TED can also cause dopants, such as boron, to diffuse into the channel region, thereby causing an unfavorable change in the dopant concentration in the channel resulting in punch-through, an increase in electron trapping, a decrease in low-field hole mobility, and a degraded on-current drive.

Another approach to reduce leakage currents is to implant a lightly doped pocket or halo region, containing dopants of the opposite dopant type of the shallow junction, around the edges of the shallow junction. The dopants in the pocket region provide increases resistance in the channel region to reduce or prevent leakage currents. However, if the pocket regions on the source and drain sides of the transistor's channel region are too close to each other, then the pocket regions will overlap. Overlap, in turn, causes excessively high resistance in the channel region, thereby undesirably reducing the on-current of the device.

One approach to reduce excessively close shallow junctions or overlapping pockets regions, is to introduce off-set spacers on the sides of gates prior to dopant implantation. The off-set spacers act as mask during the implantation of dopants to prevent dopants of the source and drain shallow junctions or pocket regions from being too close to each after the transistor is thermally annealed. This approach is not entirely successful, however, because the extent of diffusion of p-type and n-type dopants during thermal annealing are substantially different than each other.

For instance, to establish n-type doped shallow junctions in a negative channel metal oxide semiconductor (NMOS) transistor, a typical n-type dopant is arsenic ($As^+$) or phosphorus ($P^+$) However, because of their higher mass and different electrical properties than boron, arsenic and phosphorus are not subject to TED to the same extent as boron. Consequently, the fabrication steps used to mitigate the short channel effects in PMOS transistors are not necessarily beneficial to mitigate the short channel effects in NMOS transistors. Indeed, if the junctions in an NMOS transistor are too far apart, this can detrimentally decrease the source to drain saturation current of the NMOS transistor, thereby reducing the operating speed of the device. Moreover, an abrupt shallow junction depth in NMOS transistors improves $V_t$ roll-off, DIBL, gate-edge capacitance ($C_{ge}$) and mobility degradation.

Heretofore, however, the fabrication processes for PMOS and NMOS transistors in CMOS devices have resulted in the formation of shallow junctions having substantially the same geometries. As such, the geometries of one or both of the NMOS and PMOS shallow junctions have not been simultaneously optimized in both transistor types. Because current CMOS devices are constructed with compromised NMOS and PMOS shallow junction geometries, the performance of these devices is also compromised.

Accordingly, what is needed in the art is an improved method of manufacturing shallow junctions having geometries that are separately optimized for NMOS and PMOS transistor configurations.

SUMMARY OF THE INVENTION

To address the above-discussed deficiencies of the prior art, the present invention provides a method of fabricating a semiconductor device. The method comprises growing an oxide layer on a gate structure and a substrate and implanting a dopant into the substrate and the oxide layer. Implantation is such that a portion of the dopant remains in the oxide layer to form an implanted oxide layer. A protective oxide layer is deposited on the implanted oxide layer. The method also comprises forming etch-resistant off-set spacers adjacent sidewalls of the gate structure and on the protective oxide layer. The etch resistant off-set spacers have an inner perimeter adjacent the sidewalls and an opposing outer perimeter. The method additionally includes removing portions of the protective oxide layer lying outside of the outer perimeter of the etch-resistant off-set spacers.

Another embodiment of the present invention is a metal oxide semiconductor (MOS) transistor device. The semiconductor device includes a gate structure on a substrate and an oxide layer on a sidewall of the gate structure and on a portion of the substrate adjacent the gate structure. The device further comprises a protective oxide layer on the oxide layer and an oxide etch-resistant off-set spacer. The oxide etch-resistant off-set spacer is adjacent the sidewall and located on the protective oxide layer. An outer perimeter of the oxide layer and the protective oxide layer are coextensive with an outer perimeter of the oxide etch-resistant off-set spacer.

Still another embodiment of the present invention is a method of manufacturing an integrated circuit. The method includes forming metal oxide semiconductor (MOS) transistor devices, as described above, and interconnecting the MOS transistor devices with interconnects to form an operative integrated circuit.

The foregoing has outlined preferred and alternative features of the present invention so that those of ordinary skill in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features may not be drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

The present invention recognizes that for transistor devices having gate lengths of about 50 nanometers or less, it is advantageous to fabricate shallow junctions with separately optimized geometries. In certain transistor devices, for instance, MDD regions of an NMOS transistor are advantageously made shallower and having smaller off-sets, as compared to MDD regions for a PMOS transistor fabricated on the same substrate. The present invention presents fabrication processes that are separately optimized for PMOS and NMOS transistors facilitates the manufacture transistor devices having improved performance characteristics than previously realized.

Figure 1A:
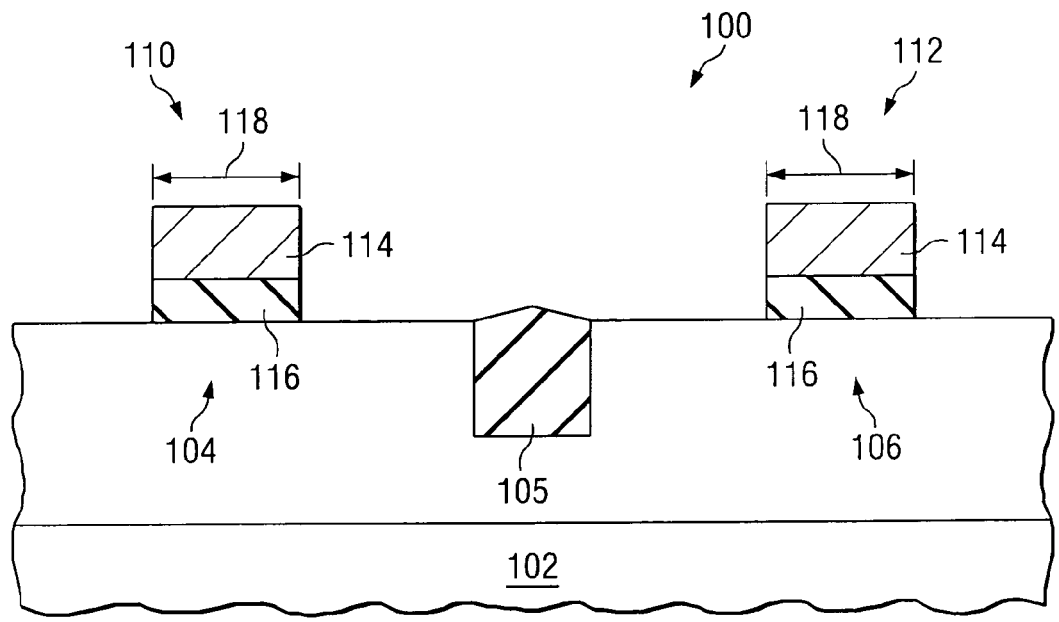
FIGS. 1A to 1I illustrate partial sectional views of selected steps in a method for fabricating a semiconductor device according to the principles of the present invention.

One embodiment of the present invention is illustrated in FIGS. 1A to 1H, which illustrate sectional views of selected steps, at various stages of manufacture, of a method for fabricating a semiconductor device 100. Turning first to FIG. 1A, illustrated is a partial sectional view of a conventionally formed semiconductor substrate 102, such as a silicon wafer. First and second portions of the substrate 104, 106 can be conventionally formed p-type and n-type substrates, respectively, separated by an isolation trench 105. In such embodiments, the p-type substrate 104 is doped with and a p-type dopant, such as boron, while the n-type substrate 104 is preferably doped with an n-type dopant, such as arsenic or phosphorus. In some embodiments, the isolation trench 105 is formed to a depth of about 400 nanometers, using conventional procedures such as lithography and chemical vapor deposition (CVD) techniques to form shallow trench isolation structures.

Conventional procedures are used to form a gate structure, such as a first and second gate structure 110, 112, each comprising a gate 114 and gate dielectric 116. In certain configurations, the gate structure includes an NMOS gate structure 110 and a PMOS gate structure 112. The gate 114 preferably comprises polysilicon, and the gate dielectric 116 comprises silicon oxide, although other well-known materials may also be used. As well known to those skilled in the art, silicon oxide and polysilicon layers can be formed over the substrate 102, and then patterned using lithography techniques to form the gate structures 110, 112 depicted in FIG. 1A. In certain advantageous embodiments, the gate structure 110, 112 has a length 118 of less than about 50 nanometers.

Figure 1B:
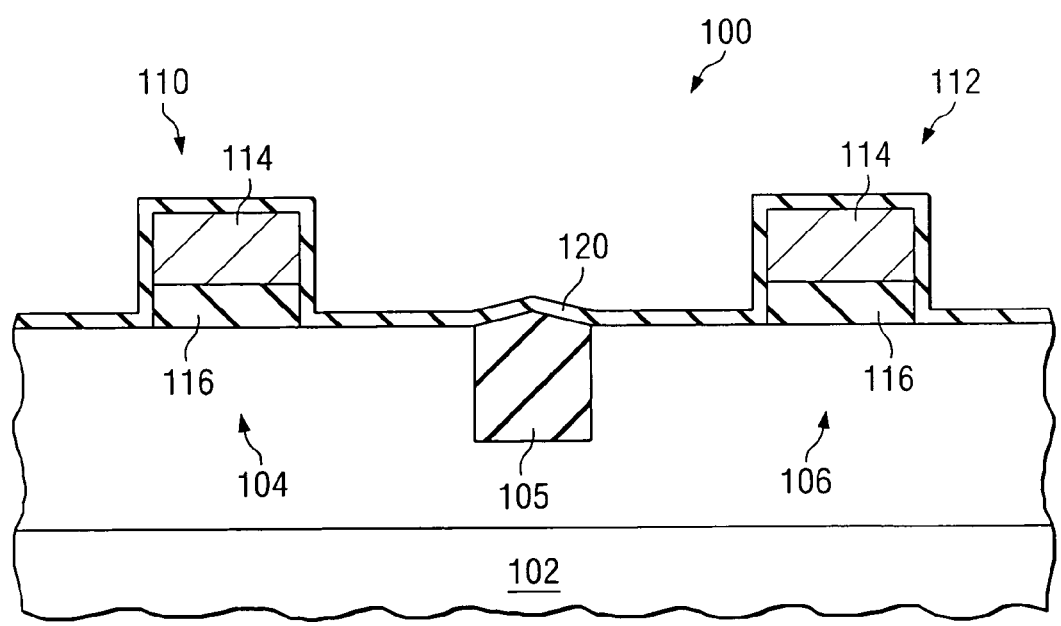

FIG. 1B shows the partially completed transistor device 100 of FIG. 1A after growing an oxide layer 120 on the gate structure 110, 112 and the substrate 102. The oxide layer 120 advantageously repairs damage to the gate structure 110, 112, caused by conventional etching processes used to form the gate structures 110, 112. While its thickness can vary, the oxide layer 120 is preferably between about 10 and about 80 Angstroms thick and is conformally grown on the gate structure 110, 112 and substrate 102. In certain advantageous embodiments, the oxide layer 120 is a layer of silicon oxide thermally grown by subjecting the partially completed device to a temperature of between about 600 and about 900° C. for between about 10 and about 100 minutes in an oxygen containing environment. In certain preferred embodiments, oxide layer 120 is grown over both the first and second gate structures 110, 112 in a single growth step.

Figure 1C:
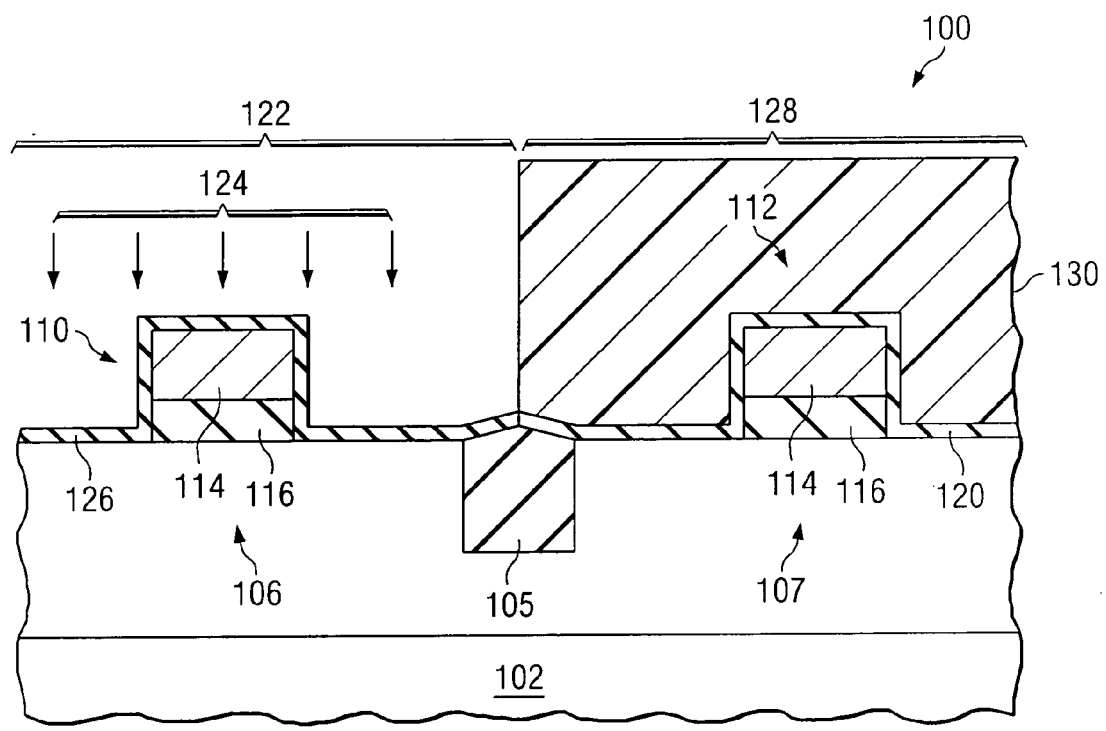

Turning to FIG. 1C, the partially completed device 100 is depicted, while implanting a dopant 124 into the substrate 102 and the oxide layer 120. In the illustrated embodiment, the dopant 124 is an n-type dopant, such as phosphorus, arsenic or a combination thereof. Implantation is such that a portion of the dopant 124 remains in the oxide layer 120 to form an implanted oxide layer 126. During implantation, preferably a first portion 122 of the substrate 102 and oxide layer 120 are exposed to the dopant 124. During such implantation, a second portion 128 of the substrate 102 and oxide layer 120 are preferably protected from exposure to the dopant 124 by an overlying layer 130, such as a photoresist, formed using conventional procedures. The gate structure 110 advantageously acts as a mask to define the portion of the substrate 102 exposed to the dopant 124.

Of course, the selection of dopant 124 type depends on the type of device being fabricated. In the illustrated embodiment, an arsenic dopant 124 is implanted at a dose of between about $2\times10^{14}$ and about $2\times10^{15}$ atoms/cm$^2$, and more preferably between about $5\times10^{14}$ and about $1\times10^{15}$ atoms/cm$^2$. Implanting also preferably includes applying an acceleration energy of between about 0.5 and about 5 keV, and more preferably between about 0.5 and about 2 keV. At such energies, a substantial portion of the n-type dopant 124 remains in the oxide layer 120, thereby forming the implanted oxide layer 126. For example, between about 10 percent to about 50 percent of a total dose of the dopant 124 used in implanting remains in the oxide layer, with the remaining dopant implanted in the underlying substrate 102.

Figure 1D:
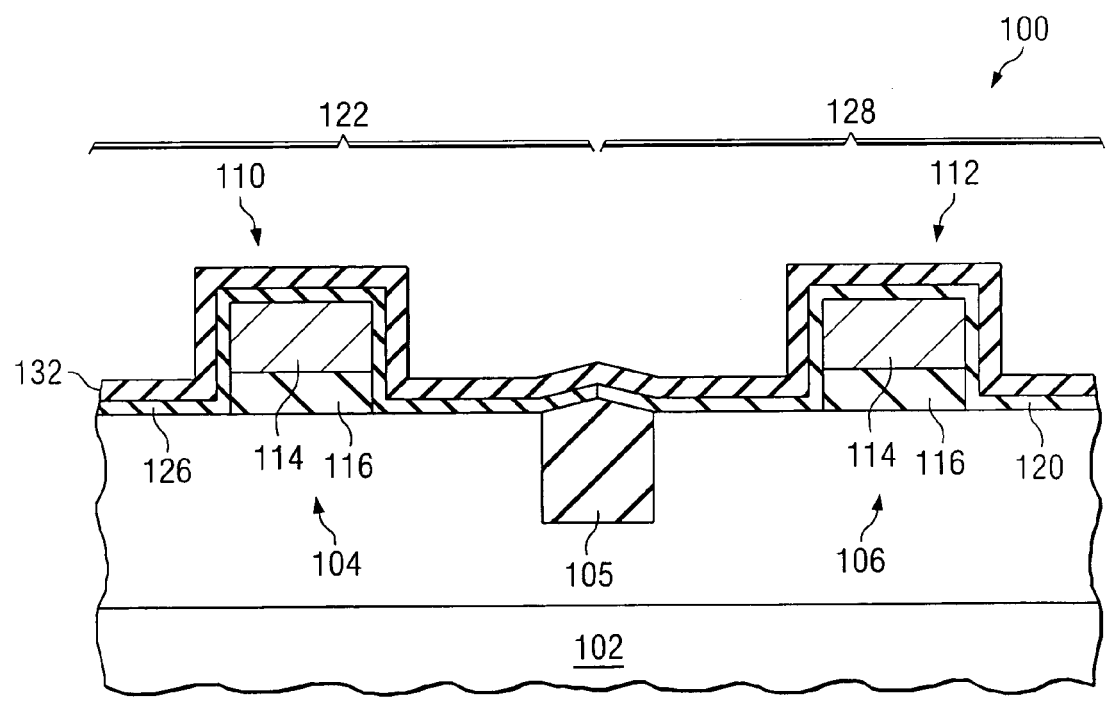

FIG. 1D shows the partially completed transistor device 100, after depositing a protective oxide layer 132 over the oxide layers 120, 126. The protective oxide layer 132 advantageously serves as an etch stop during formation of an off-set layer as discussed below. The protective oxide layer 132 also can prevent the removal of the implanted oxide layer 126, during wet etching, which is further described below. Additionally, the protective oxide layer 132 inhibits out-diffusion of the dopant 124 during a thermal anneal. In certain preferred embodiments of the method, the resist layer 130, depicted in FIG. 1C, is removed before depositing the protective oxide layer 132. In such embodiments, the protective oxide layer 132 is thus deposited over both the implanted oxide layer 126 on the first portion of the substrate 122, and the oxide layer 120 on the second portion of the substrate 128.

As illustrated in FIG. 1D, the protective oxide layer 132 conforms to the surface of oxide layer 120, 126 and therefore forms adjacent sidewalls of the gate structure 110, 112. The protective oxide layer 132 can be deposited by CVD of a silicon dioxide using a precursor, such as tetraethyl orthosilicate (TEOS). The thickness of the protective layer 132 may vary. Preferably, the protective oxide layer 132 has a thickness of between about 25 and about 100 Angstroms.

Figure 1E:
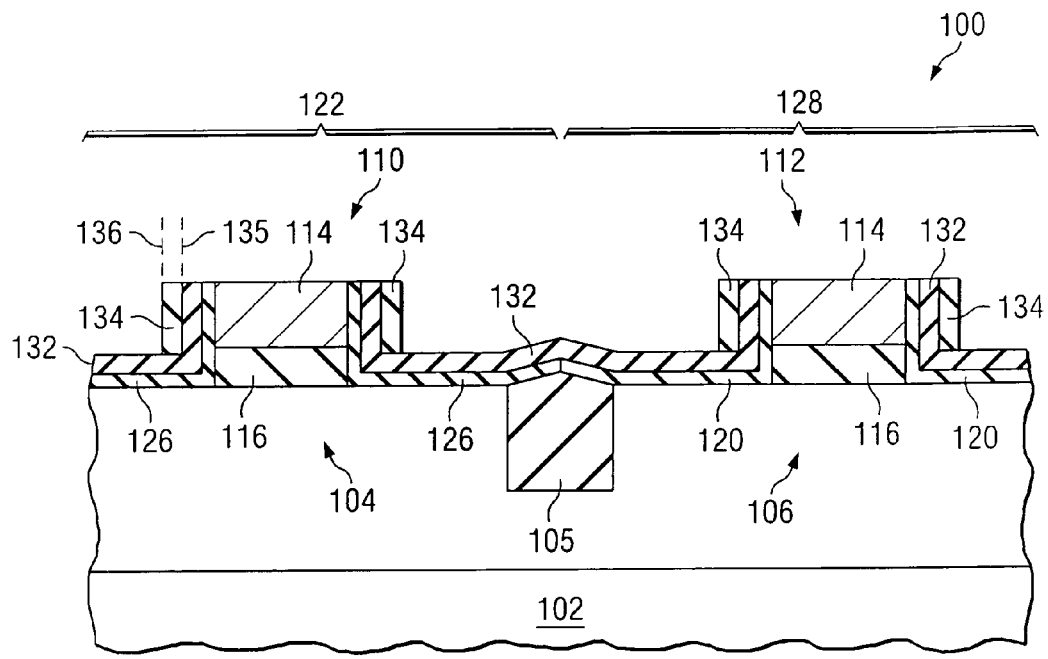

Turning now to FIG. 1E, illustrated is the partially completed transistor device 100, after forming etch-resistant off-set spacers 134 adjacent sidewalls of the gate structure 110, 112 and on the protective oxide layer 132. In certain preferred embodiments, the etch-resistant off-set spacers 134 are formed adjacent sidewalls of both the first and second gate structures 110, 112. The offset spacers 134 serve as a mask layer to separate regions that will form MDD regions after thermal annealing, as discussed below. (Moreover, the protective oxide layer 132 is an etch stop layer and it prevents the removal of the implanted oxide layer 126.)

In some advantageous configurations, the etch-resistant off-set spacer is an oxide etch-resistant off-set spacer 134. That is, the oxide etch-resistant off-set spacer 134 has a higher resistance to wet etchants, such aqueous hydrofloric acid, than the protective oxide layer 132. The oxide etch-resistant off-set spacer 134 facilitates removal of portions of the protective oxide layer as explained below. Suitable materials comprising the etch-resistant off-set spacers 134 include silicon nitride and silicon oxynitride.

In certain preferred embodiments, the etch-resistant off-set spacer 134 is formed by depositing a layer of etch-resistant material, such as silicon nitride, over the protective oxide layer 132 by chemical vapor deposition. Portions of the etch-resistant material are then removed by an anisotropic etch, such as a reactive ion etch (RIE). Thus, the etch resistant off-set spacer 134 has an inner perimeter 135 adjacent the sidewalls of the gate structure 110, 112, and an opposing outer perimeter 136. The etch-resistant off-set spacer 134 can have a horizontal thickness of between about 25 and about 100 Angstroms. However, the thickness can be varied, depending on the design.

Figure 1F:
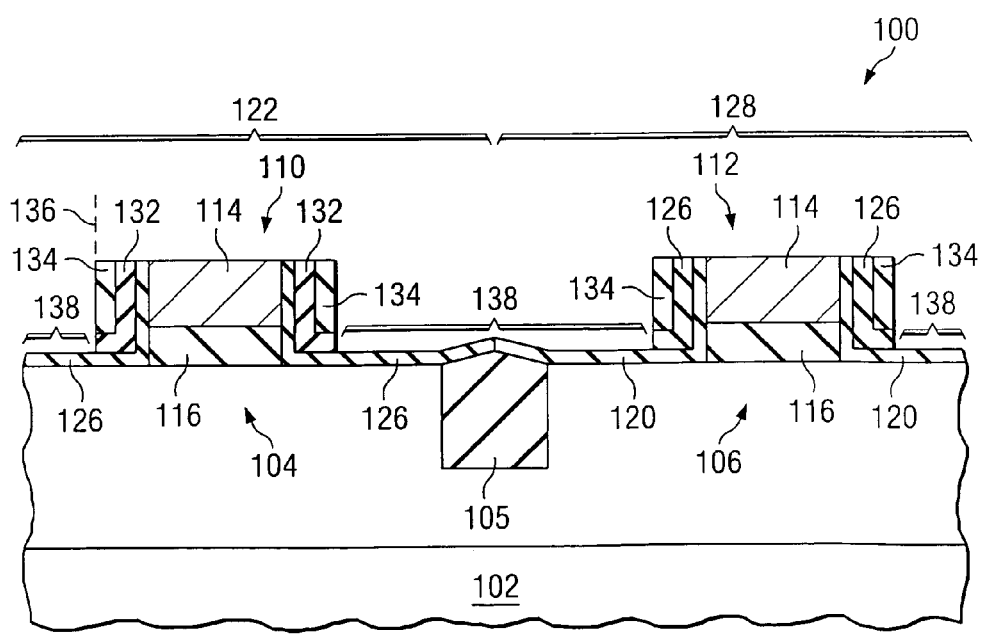

FIG. 1F shows the partially completed transistor device 100 after removing portions of the protective oxide layer 132, shown in FIG. 1E, lying outside of the outer perimeter of the etch-resistant off-set spacers 136. The portions of the protective oxide layer 132 that are removed lay over portions of the substrate 138 are separated from the gate structures 110, 112 by the off-set spacers 134.

Portions of the protective oxide layer 132 can be removed by exposing the partially completed transistor device 100 to a wet etchant, such an aqueous solution of hydrogen fluoride (HF), in a wet-etch chamber.

In some configurations, is desirable to adjust the removal conditions so as to avoid removing the implanted oxide layer 126. In such embodiments, a small portion (e.g., less than about 5 Angstroms) of the protective oxide layer 132 laying outside of the of the outer perimeter of the etch-resistant off-set spacers 136 is retained.

In alternative embodiments, however, where a thermal anneal has already been performed to diffuse the dopant 124 from the implanted oxide layer 126 into the substrate 102, more aggressive removal conditions can be used to substantially remove the entire portion of the protective oxide layer 132 laying outside of the of the outer perimeter of the etch-resistant off-set spacers 136, as illustrated.

Figure 1G:
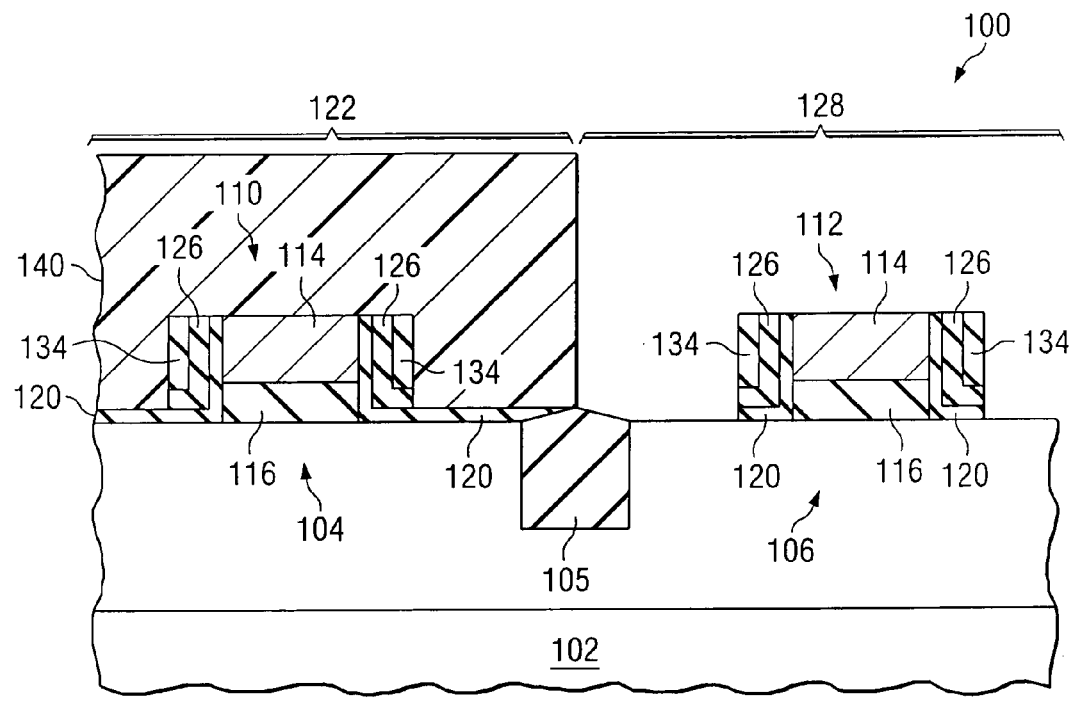

Turning now to FIG. 1G, the partially completed transistor device 100 is illustrated in preparation for a second implantation. Preferably the first portion of the substrate 122, and associated structures are protected from implantation by depositing a second photoresist layer 140 over these structures. In some cases it is also desirable to remove any remaining portions of the oxide layer 120 that are not protected by the photoresist layer 140 or the gate structure 112, because this allows better control of the second implantation. Removal can be accomplished via wet-etching similar to that described above.

Figure 1H:
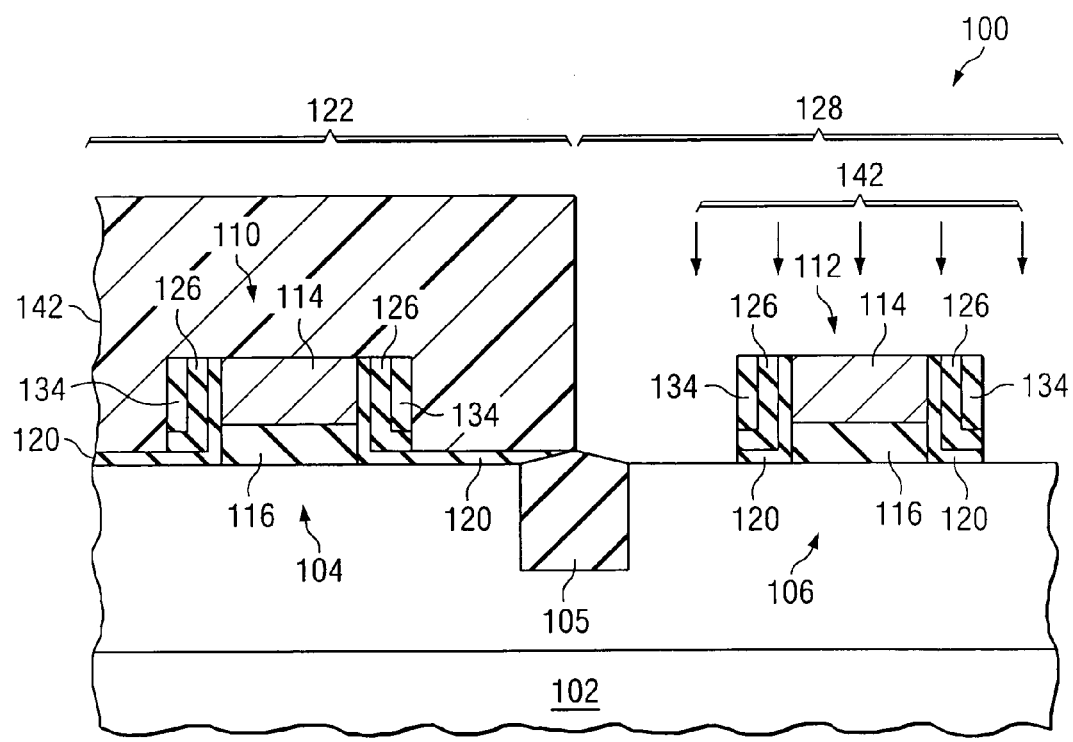

Turning now to FIG. 1H, shown is the transistor device 100, while implanting a second dopant 142 into the substrate 102. Preferably, the second dopant 142 is of the opposite dopant type as the first implanted dopant 124. As an example, where the first dopant 124 is an n-type dopant, the second dopant 142 is a p-type dopant, such as boron, and is implanted into the second portion of the substrate 128, such as an n-type substrate. Analogous to that described above, the second gate structure 112, advantageously serves as a mask to define the portion of the substrate 102 that is exposed to the second dopant 142. During the implant, As noted above, portions of the protective oxide layer 132 are removed before implanting a second dopant 142 into the substrate 102. Removing portions of the protective oxide layer 132 facilitates penetration and activation of the second dopant 142 in the substrate 102.

In other embodiments, the second dopant 142 is implanted with sufficient energy such that only trace amounts (e.g., less than about 2 percent) of the second dopant 142 remain in the oxide layer 120. For example, implanting includes implanting boron difluoride ($BF_2$) dopant at a dose of between about $3\times10^{14}$ and about $3\times10^{15}$ atoms/cm$^2$, and more preferably between about $1\times10^{15}$ and about $2\times10^{15}$ atoms/cm$^2$. Implanting the second dopant 142 preferably includes an acceleration energy of between about 1 and about 20 keV, and more preferably between about 3 and about 10 keV.

Figure 1I:
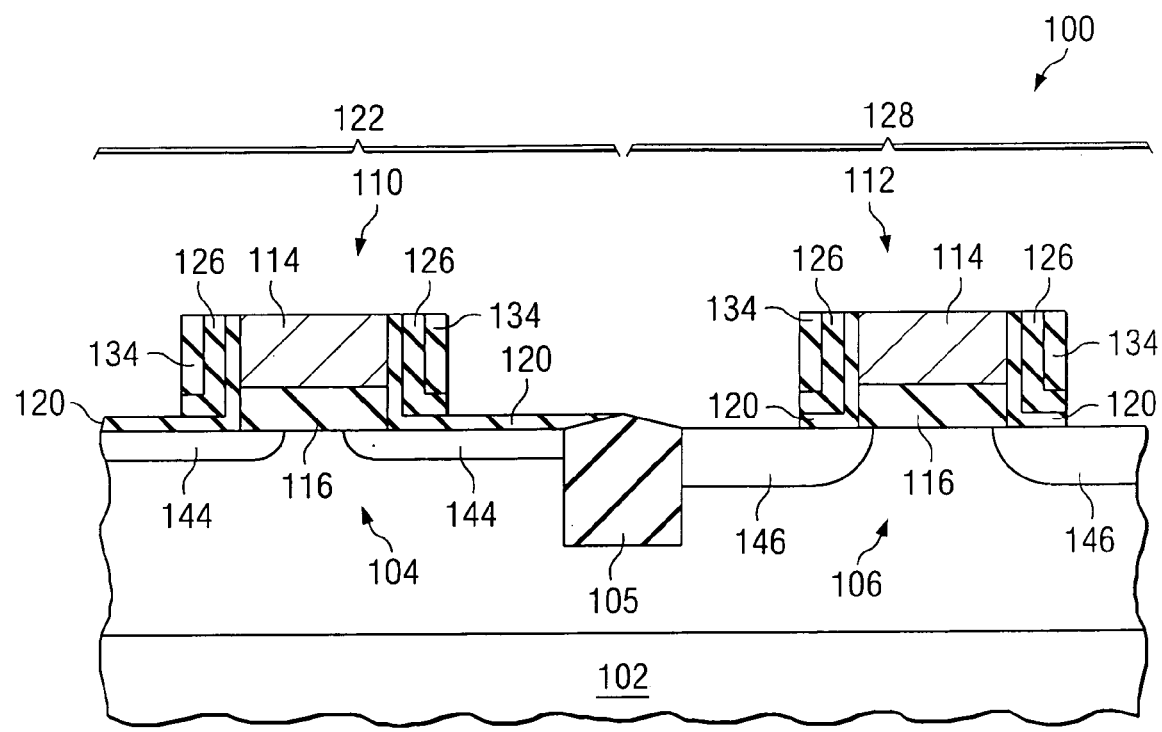

Turning now to FIG. 1I, illustrated is an embodiment of the partially completed transistor device 100 after performing a thermal anneal to form first and second dopant-type MDD regions 144, 146. In this embodiment, the first and second dopant-type MDD regions 144, 146 are n-type and p-type MDD regions, respectively. The thermal anneal is performed at a sufficient temperature and duration so as to cause the first and second dopant 124, 142 to diffuse from the implanted oxide layer 126 and surface regions of the substrate 102, to deeper levels in the substrate. The thermal anneal also advantageously serves to activate the dopants, 124, 142, as well understood by those skilled in the art.

Preferably, only one thermal anneal is performed to form the MDD regions 144, 146 in both the first and second portions of the substrate 122, 128. That is, the thermal anneal is done after implanting both the first and second dopant 124, 142 in or through the oxide layer 120 and in the substrate 102, as described above. The thermal anneal can comprise heating to a temperature of between about 900 and about 1100° C. for up to about 30 seconds, although other conditions may be used to suit the particular dopants 124, 142 being used.

In alternative aspects, however, two thermal anneals are performed. In such embodiments, a first thermal anneal is done after implanting the dopant 124 into the first portion of the substrate 122 and oxide layer 126, such as depicted in FIG. 1C. A second thermal anneal is then done after implanting the second dopant 142 in the second portion of the substrate 128, such as illustrated in FIG. 1G. Preferably, the first thermal anneal comprises heating to a temperature of between about 800 and about 1000° C. for up to about 30 seconds, and the second thermal anneal comprises heating to a temperature of between about 1000 and about 1100° C. for up to about 5 seconds.

Figure 2A:
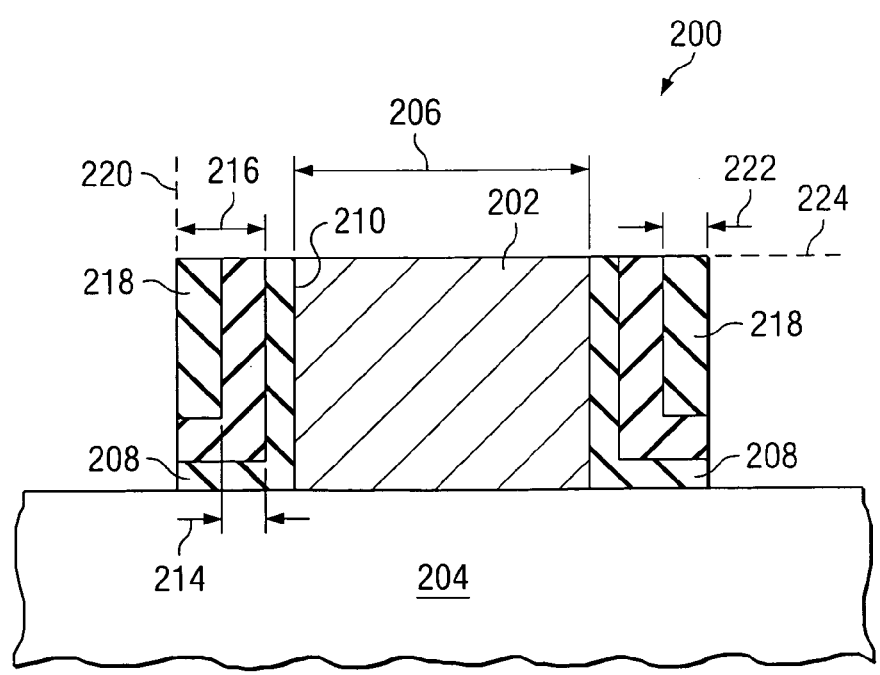
FIGS. 2A and 2B illustrate partial sectional views of metal oxide semiconductor (MOS) transistor devices of the present invention.
Figure 2B:
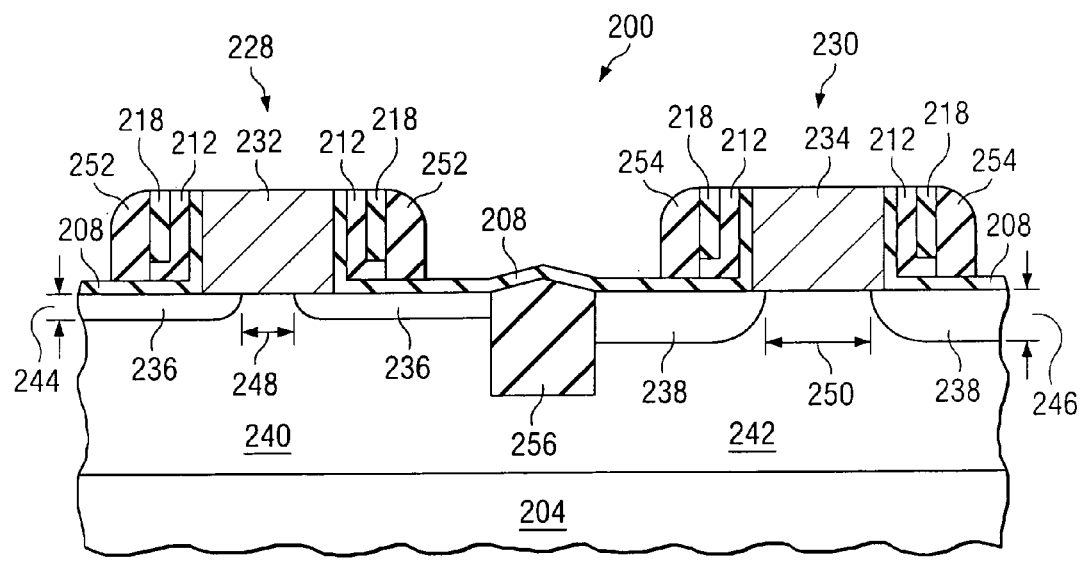

FIGS. 2A and 2B illustrate another aspect of the present invention, a metal oxide semiconductor (MOS) transistor device 200. Any of the above-described embodiments of the methods for manufacturing the semiconductor device 100 depicted in FIGS. 1A–1H may be used to fabricate the MOS devices 200 depicted in FIGS. 2A or 2B. Turning initially to FIG. 2A, the MOS transistor device 200 includes a gate structure 202 on a substrate 204. In submicron applications, the gate structure 202 preferably has a length 206 of less than about 50 nanometers.

The device 200 also includes an oxide layer 208 on a sidewall of the gate structure 202 and on a portion of the substrate 204 adjacent the gate structure 202. The oxide layer 208 can be between about 10 and about 80 Angstroms thick, although other thicknesses can be used to suit particular device applications. The device 200 further includes a protective oxide layer 212 on the oxide layer. The thickness of the protective oxide layer 214 is between about 25 and about 100 Angstroms, and more preferably, between about 50 and about 100 Angstroms. In certain preferred embodiments, the thickness of the protective oxide layer on portions of the substrate adjacent to the sidewalls 216 is about double the thickness of thickness the protective oxide structures 214 adjacent the sidewalls 210. In such embodiments, the protective oxide layer 212 thereby forms an L-, or horizontally inverted-L-, structure.

The device 200 further includes an oxide etch-resistant off-set spacer 218 adjacent the sidewall 210 and located on the protective oxide layer 212. An outer perimeter 220 of the oxide layer 208 and the protective oxide layer 212 is coextensive with an outer perimeter 220 of the oxide etch-resistant off-set spacer 218. The etch-resistant off-set spacer can have a thickness 222 of between about 25 and about 100 Angstroms, and more preferably, between about 50 and about 80 Angstroms. Preferably, a second upper outer perimeter 224 of the oxide layer 208, the protective oxide layer 212 and oxide etch-resistant off-set spacer 218 are coextensive with an outer perimeter of a ceiling of the gate structure 202.

Turning to FIG. 2B, illustrated is one embodiment of the MOS transistor device 200. Analogous reference numbers are used to identify like structures depicted in FIG. 2A. In certain preferred embodiments, the MOS transistor device 200 further includes NMOS and PMOS transistors 228, 230. Each of the NMOS and PMOS transistors 228, 230 include first and second gate structures 232, 234, the oxide layer 208, the protective oxide layer 212, and the oxide etch-resistant off-set spacers 218, similar to that depicted in FIG. 2A. The NMOS and PMOS transistors 228, 230 can be advantageously configured for use in a CMOS device 200.

In some desirable configurations, the NMOS and PMOS transistors 228, 230 include n-type and p-type MDD regions 236, 238, respectively. Any of the above-described methods can be used to form n-type and p-type MDD regions 236, 238 within the p-type substrates and n-type substrates 240, 242 of the NMOS and PMOS transistors 228, 230, respectively. A depth 244 of the n-type MDD regions are preferably about 30 to about 50 percent shallower than a depth 246 of the p-type MDD regions. For instance, in certain embodiments, the n-type MDD regions 236 have a substantially constant arsenic concentration of greater than about $1 \times 10^{20}$ atoms/cm$^3$ until a depth 244 of between about 200 and about 250 Angstroms. In other embodiments, the p-type MDD regions 238 have a substantially constant boron concentration of greater than about $1 \times 10^{20}$ atoms/cm$^3$ until a depth 246 of between about 350 and about 400 Angstroms. Of course, the depths and dopant concentrations in the n-type and p-type MDD regions 236, 238 can be varied according to particular device application requirements.

In certain advantageous embodiments of the transistor device 200, the n-type and p-type MDD regions 236, 238 formed according to the above-described methods of the present invention are separated by different amounts, as shown in FIG. 2B. For instance, the two n-type MDD regions 236 can be closer together than the two p-type MDD regions 238. As an example, the two n-type MDD regions 236 on either side of the first gate structure 232 are separated by a distance 248 that is about 20 percent closer than the distance 250 separating the two p-type MDD regions 238 on either side of the second gate structure 234. Consequently, the p-channel region 248 between the n-type MDD regions 236 is between about 10 and about 50 nanometers wide, and an n-channel region 250 between the p-type MDD regions 238 is between about 10 and about 50 nanometers.

The transistor devices 200 made be the processes of the present invention have an number of desirable electrical performance characteristics. As further illustrated in the example section to follow, NMOS transistor 228 of the present invention have favorable ratios of drain currents in the presence ($Id_{sat}$) and absence ($Id_{off}$) of an applied gate voltage (Vg=1.1 V) and constant drain voltage (Vd=1.1 V). For instance, for $Id_{sat}$ values up to about 800 μA/μm, the ratio of $Id_{off}$:$Id_{sat}$ is greater than about −10,000:1.

NMOS transistor 228 can also have favorable gate to drain capacitance (Cgd) for small gate lengths (L). For example, in some embodiments having gate lengths between about 17 and about 50 nanometers, Cgd is greater than about 0.27 fF/μm. These electrical properties are consistent with the production of p-type MDD region geometries according to the principles of the present invention as set forth above, and in example section to follow.

FIG. 2B also depicts other conventionally formed device structures, including gate sidewall spacers 252, 254, and shallow trench isolation structure 256, included in preferred embodiments to form an active transistor device 200. It should be noted that while the metal levels and corresponding interconnects are not shown, those who are skilled in the art understand how to complete such devices.

Figure 3A:
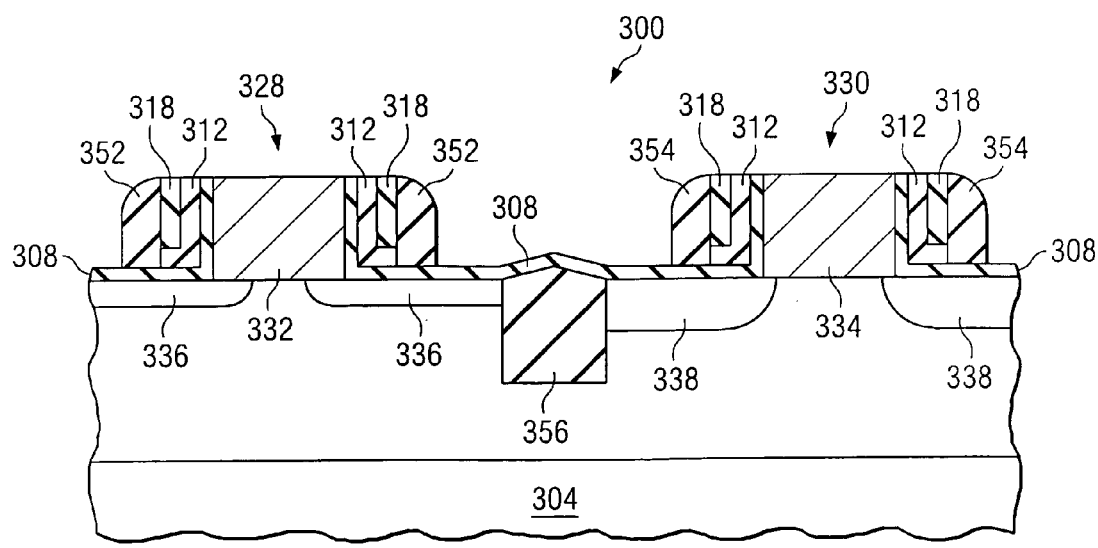
FIGS. 3A and 3B illustrate partial sectional views of selected steps in a method for manufacturing an integrated circuit according to the principles of the present invention.
Figure 3B:
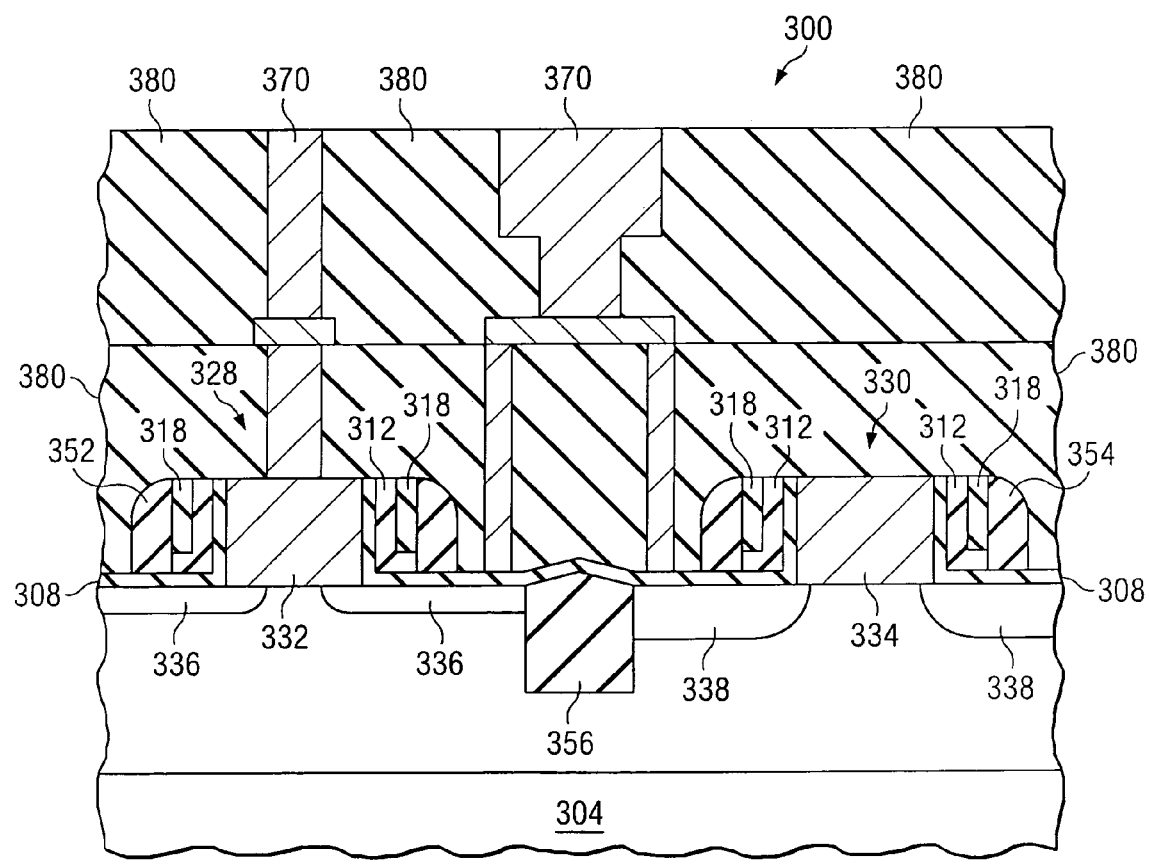

FIGS. 3A and 3B illustrate another aspect of the present invention, a method of manufacturing an integrated circuit 300. Sectional views of selected steps, at various stages of manufacture are illustrated and analogous reference numbers are used to indicate like structures depicted in FIGS. 2A and 2B. Turning to FIG. 3A, illustrated is a partial completed integrated circuit 300, after forming MOS transistor devices 328, 330. Any of the above-described embodiments of the methods for fabricating transistor devices 328, 330 according to the present invention, such as illustrated in FIG. 1A–1H and FIGS. 2A–2B, can be used to form the MOS transistor devices 328, 330.

For instance, the gate structure includes an NMOS gate structure 332 and a PMOS 334 gate structure. In such embodiments, implanting dopant includes implanting a second dopant, of opposite dopant type to the dopant adjacent the NMOS gate 332, subsequent to removing portions of the protective oxide layer 312 as described above. In some advantageous configurations, the transistor device includes NMOS and PMOS transistors 328, 330 in a complementary metal oxide semiconductor (CMOS) transistor device.

Turning to FIG. 3B, illustrated is the integrated circuit 300 after interconnecting said MOS transistor device 328, 330 with interconnects 370 to form an operative integrated circuit 300. Certain preferred embodiments, of the method of manufacturing the integrated circuit 300 further includes using conventional method to form interlevel dielectric levels 380.

Although the present invention has been described in detail, one of ordinary skill in the art should understand that they can make various changes, substitutions and alterations herein without departing from the scope of the invention.

What is claimed is:

1. A method of fabricating a semiconductor device, comprising:
    growing an oxide layer on a gate structure and a substrate;
    implanting a dopant into said substrate and said oxide layer such that a portion of said dopant remains in said oxide layer to form an implanted oxide layer;
    depositing a protective oxide layer on said implanted oxide layer;
    forming etch-resistant off-set spacers adjacent sidewalls of said gate structure and on said protective oxide layer said etch resistant off-set spacers having an inner perimeter adjacent said sidewalls and an opposing outer perimeter; and
    removing portions of said protective oxide layer lying outside of said outer perimeter of said etch-resistant off-set spacers.

2. The method as recited in claim 1, wherein said implanted oxide layer contains between about 10 and about 50 percent of a total dose of said dopant used in said implanting.

3. The method as recited in claim 1 wherein said gate structure is an NMOS gate structure and said dopant is an n-type dopant.

4. The method as recited in claim 3, wherein said implanting includes implanting an arsenic dopant using a dose of between about $2 \times 10^{14}$ and about $2 \times 10^{15}$ and an acceleration energy of between about 0.5 and 5 keV.

5. The method as recited in claim 3 wherein growing said oxide layer includes growing said oxide layer over a PMOS gate structure and wherein said forming etch resistant off-set spacers includes forming etch-resistant spacer adjacent sidewalls of said PMOS gate structure and further including implanting a p-type dopant adjacent said PMOS gate subsequent to said removing.

6. The method as recited in claim 5, wherein implanting said p-type dopant includes implanting boron at a dose of between about $3 \times 10^{14}$ and about $3 \times 10^{15}$ atoms/cm$^2$ and an acceleration energy of between about 1 and about 20 keV.

7. The method as recited in claim 1, further includes thermally annealing after said implanting, said thermal annealing comprising heating to a temperature of between about 900 and about 1100° C. for up to about 30 seconds to form a first type dopant MDD regions within said substrate adjacent said gate structure.

8. The method as recited in claim 1, further includes thermally annealing after said implanting of said dopant and of a second dopant, having an opposite dopant type of said dopant, to form first and second dopant type MDD regions within said substrate.

9. A method of manufacturing an integrated circuit, comprising:
    forming a metal oxide semiconductor (MOS) transistor device, including:
        growing an oxide layer on a gate structure and a substrate;
        implanting a dopant into said substrate and said oxide layer such that a portion of said dopant remains in said oxide layer to form an implanted oxide layer;
        depositing a protective oxide layer on said implanted oxide layer;
        forming etch-resistant off-set spacers adjacent sidewalls of said gate structure and on said protective oxide layer said etch resistant off-set spacers having an inner perimeter adjacent said sidewalls and an opposing outer perimeter; and
        removing portions of said protective oxide layer lying outside of said outer perimeter of said etch-resistant off-set spacers; and
    interconnecting said MOS transistor device with interconnects to form an operative integrated circuit.

10. The method as recited in claim 9, wherein said implanted oxide layer contains at least about 40 percent of a total dose of said dopant used in said implanting.

11. The method as recited in claim 9, wherein implanting said dopant includes implanting arsenic dopant using a dose of between about $2 \times 10^{14}$ and about $2 \times 10^{15}$ and an acceleration energy of between about 0.5 and 5 keV.

12. The method as recited in claim 9, wherein said gate structure includes an NMOS gate structure and a PMOS gate structure, and wherein said implanting includes implanting a second dopant of opposite dopant type to said dopant adjacent said NMOS gate subsequent to said removing.

13. The method as recited in claim 9, wherein said transistor device includes NMOS and PMOS transistor devices in a complementary metal oxide semiconductor (CMOS) transistor device.

* * * * *